United States Patent [19]

Bauer

[11] Patent Number: 4,733,181
[45] Date of Patent: * Mar. 22, 1988

[54] SINGLE-WINDING MAGNETOMETER WITH SCHMITT TRIGGER OUTPUT CIRCUIT

[75] Inventor: Harald Bauer, Nuremberg, Fed. Rep. of Germany

[73] Assignee: Robert Bosch GmbH, Stuttgart, Fed. Rep. of Germany

[*] Notice: The portion of the term of this patent subsequent to Mar. 1, 2005 has been disclaimed.

[21] Appl. No.: 745,391
[22] PCT Filed: Nov. 14, 1984
[86] PCT No.: PCT/DE84/00244
    § 371 Date: Jun. 10, 1985
    § 102(e) Date: Jun. 10, 1985
[87] PCT Pub. No.: WO85/02912
    PCT Pub. Date: Jul. 4, 1985

[30] Foreign Application Priority Data
Dec. 17, 1983 [DE] Fed. Rep. of Germany ....... 3345713

[51] Int. Cl.⁴ ................. G01R 33/04; G01L 17/28
[52] U.S. Cl. ........................ 324/253; 33/361
[58] Field of Search ............... 324/253–255, 324/247; 33/361

[56] References Cited
U.S. PATENT DOCUMENTS

| 3,197,880 | 8/1965 | Rice et al. | 324/247 |
| 3,461,382 | 8/1969 | Anderson | 324/255 |
| 3,568,052 | 3/1971 | Anderson | 324/255 |
| 3,812,428 | 5/1974 | Trenhler | 324/253 |
| 3,936,949 | 2/1976 | Devaud | 324/255 |
| 4,290,018 | 9/1981 | Rhodes | 324/255 |

FOREIGN PATENT DOCUMENTS
0111265 12/1983 European Pat. Off.
1207313 9/1970 United Kingdom ............... 324/255

Primary Examiner—Gerard R. Strecker
Assistant Examiner—Walter E. Snow
Attorney, Agent, or Firm—Frishauf, Holtz, Goodman & Woodward

[57] ABSTRACT

A magnetometer (11) for time coded measurement of magnetic fields, which comprises at least one sensor (15) having a magnetizable, rod-shaped core (20) and a winding (19) disposed on the core. To generate an auxiliary alternating field, the winding (19) carries an alternating current, which together with the magnetic field that is to be measured generates in the winding a measurement voltage, the positive and negative half-waves of which deviate from one another as a function of the magnitude of the magnetic field that is to be measured. To attain a simple and accurate evaluation of the measurement voltage, this measurement voltage is applied to the input of the limit-value switch (25), the output (26) of which produces a rectangular voltage, the duty cycle of which directly represents a measure for the magnetic field detected by the core (15) of the sensor. The magnetometer is applicable to the measurement of constant magnetic fields, in particular to measure the geomagnetic field in an electronic compass for vehicles.

7 Claims, 3 Drawing Figures

SINGLE-WINDING MAGNETOMETER WITH SCHMITT TRIGGER OUTPUT CIRCUIT

The invention relates to a magnetometer with time coded output of measured magnetic fields, as defined by the preamble background: The use of magnetometers with time coding for measuring the earth's magnetic field is already known from German Pat. No. 16 23 577. The magnetometer includes a sensor having a magnetizable rod-shaped core, on which two windings are arranged. One winding serves to generate an auxiliary alternating field, by being connected to an alternating voltage by means of which the core is magnetized in alternation up to and into saturation. At the other winding, a measurement voltage is picked up, which serves to ascertain the magnetic field that is to be measured. To this end, the measurement voltage is differentiated with a resistor-capacitor element. By means of the magnetic field that is to be measured, which acts in the direction of the sensor axis, at time shift of the extreme values of the measurement voltage is effected, the magnitude of the shift being a measure for the intensity of the measured magnetic field. Via a comparator, the differentiated measurement voltage can be converted into a digital value corresponding to the intensity of the magnetic field. This arrangement has the disadvantage, however, that with the resistor-capacitor element and the comparator, the evaluation circuit is relatively expensive. Furthermore, the resistor-capacitor element causes damping of the signal voltage that is to be evaluated, and the measuring accuracy is affected by the temperature-dependent capacitance of the resistor-capacitor element.

With the present invention, the object is to simplify the evaluation circuit.

The Invention

The magnetometer according to the invention has the advantage that the measurement voltage, without being damped by a resistor-capacitor element, is converted directly into a pulse length modulated rectangular signal by the limit-value switch, and a linear relationship between the duty cycle of the rectangular signal at the output of the circuit and the measured magnetic filed is attained. A further advantage is that by using the limit-value switch, the measurement voltage need not have any pronounced extreme values, thereby also enabling greater tolerances in terms of the requirements for the form taken by the sensor core and its properties.

Advantageous further developments and improvements are attainable by means of other features of the invention. A particular advantage is attained if the limit-value switch comprises a Schmitt trigger with switching limits that are symmetrical with respect to one another. A particularly simple arrangement can be attained by providing that merely a single winding disposed on the core serves to generate both the auxiliary alternating field and the measurement voltage. In so doing, in order to generate the auxiliary alternating field a triangle (wave shape) generator is connected to the winding via a current source connected to its output and controlled by the voltage of the triangle generator, with one connection of the triangle generator and of the winding being connected to a reference voltage. To amplify the measurement voltage induced in the winding, the end of the winding that is not connected to reference voltage is connected to one input of a subtracting amplifier, and the output of the triangle generator that is not connected to reference voltage is connected to the other input of the subtracting amplifier. The output of the subtracting amplifier is then connected directly to the input of the Schmitt trigger.

DRAWING

One exemplary embodiment of the invention is shown in the drawing and described in further detail below.

DESCRIPTION OF THE EXEMPLARY EMBODIMENT

Figure 1:
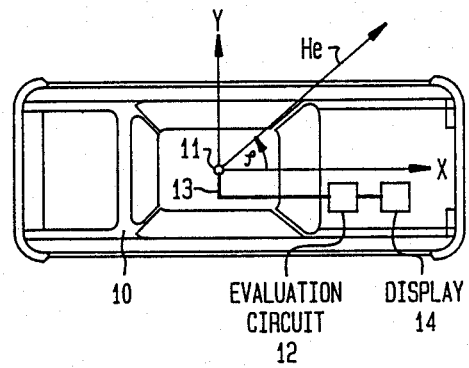
FIG. 1 shows a motor vehicle in which the driving direction is ascertained by measuring the geomagnetic field, using an electronic compass having a magnet ometer.
Figure 2:
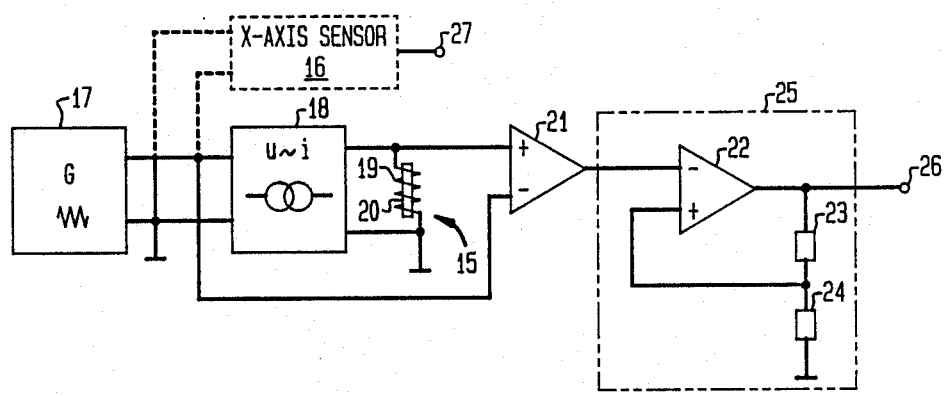
FIG. 2 shows the circuit of a magnetometer for measuring a magnetic field component detected by a sensor.

In FIG. 1, a motor vehicle is shown in plan view and identified by reference numeral 10. To determine the driving direction, the motor vehicle 10 is equipped with an electronic compass, which comprises a magnetometer 11 and an evaluation circuit 12. The magnetometer 11 is disposed under the roof of the motor vehicle 10, approximately in the middle of the vehicle, and is joined via a cable 13 with the evaluation circuit 12, which is accommodated in the dashboard of the vehicle 10. The evaluation circuit 12, provided with a computer, is connected to a visual display 14, which indicates to the driver either the instantaneous driving direction or perhaps the direction to be steered toward in order to reach a previously entered destination. The magnetometer 11 serves to measure the direction of the geomagnetic field with respect to the longitudinal axis of the motor vehicle 10. To this end, the magnetometer 11 is equipped with two sensors, offset by 90° from one another, one of which is shown in FIG. 2. One of the two sensors is located on the X axis, and thus in the direction of the longitudinal axis of the motor vehicle 10, while the other sensor is located transversely to its, in the direction of the Y axis. The vector of the geomagnetic field $H_e$ forms an angle $\phi$ with the X axis. to ascertain this angle, the X component and the Y component, respectively, of the geomagnetic field $H_e$ are measured in the two sensors of the magnetometer 11, and the resultant measured values are delivered to the evaluation circuit 12, in which in a manner known per se the angle $\phi$ can be calculated and the driving direction, or the deviation between the driving direction and the direction to the previously specified destination, can be ascertained by means of the computer.

FIG. 2 shows the circuit layout of the magnetometer 11, in which the circuit branch having the sensor 15 located in the direction of the Y axis is shown in detail and will be described in detail below. The circuit branch for the sensor located in the direction of the X-axis, which is laid out identically, is shown in broken lines as circuit block 16, for the sake of simplicity. Both circuit branches are supplied by a triangle generator 17, at the output of which an auxiliary alternating voltage $U_h$, shown in FIG. 3, having an amplitude of 500 mV and a frequency of $f = 1$ kHz, appears. The output of the triangle generator 17 is connected to the input of a voltage controlled current source 18, with one connection being connected to ground voltage. The output of the current source 18 is connected to a winding 19, which is disposed on a highly permeable, rod-shaped core 20 of the sensor 15. The winding 19 is likewise disposed with one end connected to ground voltage. The other end of the winding 19 is furthermore connected to the positive input of a subtracting amplifier 21, the negative input of which is connected to the output of the triangle generator 17 that is not connected to ground. The output of the substracting amplifier 21 is connected to the input of a limit-value switch, which comprises a Schmitt trigger 25 having switching limits symmetrical to one another. The Schmitt trigger comprises an operational amplifier 22, the negative input of which is connected to the output of the subtracting amplifier 21 and the positive input of which is connected to the pickup of a voltage divider comprising the resistors 23 and 24 and located between the output of the operational amplifier 22 and the ground voltage. The circuit block 16 likewise includes, for the sensor located in the X direction and not shown, a voltage-controlled current source 18, a substracting amplifier 21 and a Schmitt trigger 25, laid out in a corresponding manner. The outputs 26 and 27 of the circuit layout are to be connected to the evaluation circuit 12, 14 (FIG. 1) via the cable 13.

Figure 3:
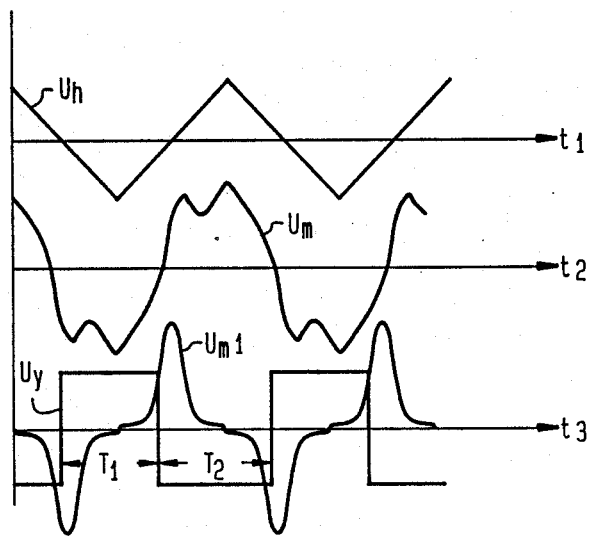
FIG. 3 shows the course of the voltage at various points in the circuit of FIG. 2.

The functioning of the magnetometer 11 will now be explained in further detail, referring to the voltage courses shown in FIG. 3. The auxiliary alternating voltage $U_h$ appearing at the output of the triangle generator 17 is plotted on the time axis $t_1$. It controls the current source 18 in such a manner that in the winding 19 connected to its output, a correspondingly triangular auxiliary alternating current appears, which generates an auxiliary alternating field in the magnetizable core 20 of the sensor 15. By means of this auxiliary alternating field, the core 20 is magnetized in alternation, that is, in alternating directions, up to and into saturation. Since the core 20 is also traversed by the Y component of the geomagnetic field $H_e$ (FIG. 1), the two fields are superimposed on one another in the core 20. The Y component of the geomagnetic field $H_e$ embodies the magnetic field that is to be measured with the sensor 15 and which traverses the core 20 in only one direction and thereby causes the core 20 to enter the saturation range earlier in one magnetizing direction, while in contrast it delays saturation in the opposite magnetizing direction. The magnetic field to be measured and the auxiliary alternating field generated by the alternating current, together with the applied voltage at the winding 19 which drives the magnetizing current, generate a measurement voltage $U_m$, which is plotted in FIG. 3 on the time axis $t_2$. By means of the subtracting amplifier 21, the auxiliary alternating voltage $U_h$ of the triangle generator 17 is now subtracted from the measurement voltage $U_m$ to such an extent that at the output of the subtracting amplifier 21, the amplified measurement voltage $U_m1$ plotted on the time axis $t_3$ now appears, which corresponds to the voltage induced in the winding 19 by the entire magnetic field. The positive and negative half-waves of the measurement voltage $U_m$ at the winding 19 or of the amplified measurement voltage $U_m1$ at the output of the subtracting amplifier 21 deviate from one another in accordance with the magnetic field that is to be measured. The magnitude of the deviation is a measure for the magnitude of the measured magnetic field at the sensor 15 and hence is a measure for the Y component of the geomagnetic field $H_e$. To ascertain this deviation between the positive and negative half-waves, the amplified measurement voltage $U_m1$ at the output of the subtracting amplifier 21 is applied to the input of the Schmitt trigger 25. The rectangular output voltage $U_y$ thereby generated at the output 26 and plotted on the time axis $t_3$ is delivered to the evaluation circuit 12 (FIG. 1), and the duty cycle of the rectangular voltage, that is, the ratio of the duration $T_1$ of the positive amplitude to the duration $T_2$ of the negative amplitude represents a measure of the magnitude of the Y component of the geomagnetic field $H_e$. The duty cycle $T_1/(T_1+T_2)$ is ascertained by the computer, preferably a microcomputer, of the evaluation circuit 12 and further processed or stored.

In the same manner, the X component of the geomagnetic field $H_e$ is ascertained in the circuit block 16 and delivered to the evaluation circuit 12 (FIG. 1) via the output 27 in the form of a pulse length modulated rectangular voltage having a duty cycle corresponding to the X component of the geomagnetic field. If the geomagnetic field that is to be ascertained is located directly in the driving direction, that is, in the direction of the X axis or transversely to it, that is, in the direction of the Y axis, then the magnetic field is measured at only one sensor. At the other sensor, the magnetic field component is equal to zero. Accordingly, a measurement voltage having exactly identical positive and negative half-waves is generated at this sensor, and hence the duty cycle of the associated output voltage $U_y$ or $U_x$ equals 50%.

For constructing the circuit according to FIG. 2, operational amplifiers, which are to be supplied with a stabilized direct voltage, can be used for the triangle generator 17, the voltage controlled current source 18, and for the subtracting amplifier 21 and the Schmitt trigger 25. This supply voltage may likewise be carried over the line 13. Within the scope of the invention, it is also possible for the two sensors of the magnetometer 11, rotated by 90° from one another, to be provided with only one voltage controlled current source 18 as well as one subtracting amplifier 21 and only one Schmitt trigger 25. In this case, the output of the current source 18 as well as the positive input of the subtracting amplifier 21 must be switched over from one sensor to the other at fixed time intervals. However, it is equally possible for only the outputs of the subtracting amplifier 21 to be applied to a common Schmitt trigger, by continuous switching reversals. In both cases, only one signal line from the magnetometer 11 to the evaluation circuit 12 is required, which then must be switched over in synchronism with the magnetometer 11. Within the scope of the invention, however, it is equally possible to combine the magnetometer 11 with the evaluation circuit 12 and the display unit 14 three-dimensionally into an electronic compass. On the other hand, the two sensors can also be disposed at some suitable location in the motor vehicle, for instance under the rear window, separately from the rest of the electronic system. Finally, an electronic compass can also be operated with only one sensor 14. In that case, the direction of the geomagnetic field and hence the direction of the north pole is ascertained in that the sensor 15 having the horizontally disposed magnetizable core 20 is rotated until such time as the magnetic field that is to be measured produces a maximum measured value. Furthermore, the magnetometer can be used quite generally for measuring magnetic fields, so long as these are direct fields or low-frequency alternating fields, which during measurement vary neither in direction nor in intensity. In that case, an evaluation stage connected to the output of the Schmitt trigger 25, for ascertaining the duty cycle of the rectangular voltage, and optionally a display device are also integrated into the magnetometer.

I claim:

1. Magnetometer for time coded measurement of constant magnetic fields, comprising at least one sensor having a magnetizable rod-shaped core (20) and a single, dual-purpose winding (19) disposed on the core, the winding both carrying an alternating current for generating an auxiliary alternating magnetic field which magnetizes the core (20) up to and into saturation alternately in each of two directions and, together with the magnetic field that is to be measured, generating a measurement voltage ($U_m$, $U_{m1}$), the positive and negative half-waves of which deviate from one another as a function of the magnetic field that is to be measured and serve to indicate the magnitude of the magnetic field that is to be measured, and wherein the measurement voltage ($U_m$, $U_{m1}$) is applied to an input of a substracting amplifier (21) for substracting a voltage derived from said alternating current, and whose output is applied to the input of a Schmitt trigger switch (25) having switching limits that are symmetrical to one another and an output which is a rectangular-wave voltage signal ($U_y$), the duty cycle of which is a measure of the magnetic field detected by the core (20).

2. Magnetometer according to claim 1, characterized in that for generating the auxiliary alternating field and for generating the measurement voltage ($U_m$), only one winding (19) disposed on the core (20) is used.

3. Magnetometer according to claim 2, characterized in that for generating the auxiliary alternating field, a triangle generator (17) is connected, via a current source (18) connected to its output and controlled by the voltage ($U_h$) of the triangle generator (17), to the winding (19) disposed on the core (20).

4. Magnetometer according to claims 1, characterized in that for ascertaining the magnitude and direction of the magnetic field to be measured, two horizontally disposed sensors (15), rotated by 90° with respect to one another, are provided, of which one sensor detects the X component and the other sensor detects the Y component of the magnetic field.

5. Magnetometer for time coded measurement of constant magnetic fields, comprising at least one sensor having a magnetizable rod-shaped core (20) and a single winding (19) disposed on the core, the winding carrying an alternating current and voltage ($U_h$) for generating an auxiliary alternating magnetic field which magnetizes the core (20) up to and into saturation alternately in each of two directions and, together with the magnetic field that is to be measured, generates a measurement voltage ($U_{m1}$), the positive and negative half-waves of which deviate from one another as a function of the magnetic field that is to be measured and which serve to indicate the magnitude of the magnetic field that is to be measured, and wherein the measurement voltage ($U_{m1}$) is applied to the input of a Schmitt trigger switch (25) having switching limits that are symmetrical to one another and an output which is a rectangular-wave voltage signal ($U_y$), the duty cycle of which is a measure of the magnetic field detected by the core (20);

means are provided for generating the auxiliary alternating field, including a triangle generator (17) generating said alternating voltage ($U_h$) connected to the winding (19) disposed on the core;

and means (18,21) are provided, for subtraction of said alternating voltage ($U_h$) from an output voltage signal ($U_m$) of the winding (19) to obtain said measurement voltage ($U_{m1}$), and for amplification of the measurement voltage ($U_{m1}$), prior to its application to said Schmitt trigger switch (25), wherein one end of the winding (19) is connected to one input of a subtracting amplifier (21) and one output of the triangle generator (17) is connected with the other input of the subtracting amplifier, the other output of the triangle generator (17) and the other end of the winding (19) being connected to a common reference voltage level, and the output of said subtracting amplifier (21) is connected to said input of said Schmitt trigger switch (25).

6. Magnetometer according to claim 5 wherein said means for subtraction and amplification comprises, in addition to said subtracting amplifier (21), a current source (18) connected to an output of said triangle generator (17), controlled by the alternating output voltage ($U_h$) of the triangle generator (17), and having an output connected to the winding (19) disposed on the core.

7. Magnetometer according to claim 5, characterized in that the output of the subtracting amplifier (21) is connected to the input of the Schmitt trigger (25), the output of which is connected to an evaluation stage (12) ascertaining the duty cycle of the output voltage ($U_y$).

* * * * *